US012665533B2

(12) United States Patent
Lee et al.

(10) Patent No.: US 12,665,533 B2
(45) Date of Patent: Jun. 23, 2026

(54) TRANSPORT SYSTEM INCLUDING DISTURBANCE OBSERVER AND CONTROL METHOD THEREOF

(71) Applicant: SEMES CO., LTD., Chungcheongnam-do (KR)

(72) Inventors: Jun Beom Lee, Gyeonggi-do (KR); Yeong Jae Choe, Gyeonggi-do (KR); Dong Hoon Yang, Gyeonggi-do (KR); Byung Kwon Lee, Gyeonggi-do (KR)

(73) Assignee: SEMES CO., LTD., Chungcheongnam-do (KR)

( * ) Notice: Subject to any disclaimer, the term of this patent is extended or adjusted under 35 U.S.C. 154(b) by 771 days.

(21) Appl. No.: 18/091,372

(22) Filed: Dec. 30, 2022

(65) Prior Publication Data

US 2023/0327595 A1 Oct. 12, 2023

(30) Foreign Application Priority Data

Mar. 22, 2022 (KR) ........................ 10-2022-0035485

(51) Int. Cl.
| | |
|---|---|
| *H02P 23/14* | (2006.01) |
| *B65G 43/02* | (2006.01) |
| *H10P 72/30* | (2026.01) |

(52) U.S. Cl.
CPC .............. *H02P 23/14* (2013.01); *B65G 43/02* (2013.01); *H10P 72/3218* (2026.01); *H10P 72/3221* (2026.01)

(58) Field of Classification Search
CPC .. H02P 23/14; H02P 23/12; H02P 5/00; H02P 5/46; B65G 43/02; H01L 21/6773;
(Continued)

(56) References Cited

U.S. PATENT DOCUMENTS

| | | | | |
|---|---|---|---|---|
| 5,872,439 A | * | 2/1999 | Nomura | ................. H02P 23/16 |
| 8,803,466 B2 | * | 8/2014 | Yoshiura | ............... G05B 19/19 |
| | | | | 318/630 |

(Continued)

FOREIGN PATENT DOCUMENTS

| | | | | |
|---|---|---|---|---|
| CN | 111146991 A | * | 5/2020 | .......... H02P 21/0007 |
| JP | 2000-217209 | | 8/2000 | |

(Continued)

OTHER PUBLICATIONS

Notice of Allowance dated Feb. 6, 2024 for Korean Patent Application No. 10-2022-0035485 and its English translation from Global Dossier.

*Primary Examiner* — Patrick H Mackey
(74) *Attorney, Agent, or Firm* — WOMBLE BOND DICKINSON (US) LLP

(57) ABSTRACT

Provided is a transport system to minimize an interference between motors of a transport vehicle. The transport system comprises: a first motor controller corresponding to a first wheel and configured to generate a first current value; a first motor system configured to move based on the first current value and provide a first position value according to the movement; a disturbance observer configured to receive the first current value and the first position value and calculate a first disturbance value affecting the first motor system; a second motor controller corresponding to a second wheel and configured to generate a second current value; a compensation current generator configured to generate a second compensation current value based on the second current value and the first disturbance value; and a second motor system configured to move by the second compensation current value and provide a second position value according to the movement.

15 Claims, 9 Drawing Sheets

(58) Field of Classification Search
CPC ......... H01L 21/67733; H01L 21/67253; H01L
21/67724; H01L 21/67242
See application file for complete search history.

(56) References Cited

U.S. PATENT DOCUMENTS

| | | | | |
|---|---|---|---|---|
| 12,330,655 B2 * | 6/2025 | Yoon | ..................... | B60L 15/20 |
| 2011/0178667 A1 * | 7/2011 | Senba | .................... | B60L 15/20 |
| | | | | 701/22 |

FOREIGN PATENT DOCUMENTS

| | | | | |
|---|---|---|---|---|
| JP | 2010-51104 | | | 3/2010 |
| JP | 2011036061 | A | * | 2/2011 |
| JP | 2012-146171 | | | 8/2012 |
| JP | 2013118817 | A | * | 6/2013 |
| JP | 2017-60327 | | | 3/2017 |
| JP | 2024058925 | A | * | 4/2024 |
| KR | 10-2131729 | | | 7/2020 |
| KR | 10-2021-0043785 | | | 4/2021 |

* cited by examiner

TRANSPORT SYSTEM INCLUDING DISTURBANCE OBSERVER AND CONTROL METHOD THEREOF

CROSS-REFERENCE TO RELATED APPLICATION

This application claims priority from Korean Patent Application No. 10-2022-0035485 filed on Mar. 22, 2022 in the Korean Intellectual Property Office, and all the benefits accruing therefrom under 35 U.S.C. 119, the contents of which in its entirety are herein incorporated by reference.

BACKGROUND

1. Technical Field

The present disclosure relates to a transport system including a disturbance observer and a control method thereof.

2. Description of the Related Art

In the manufacturing process of a semiconductor device, a substrate may be transferred through an unmanned transport system. Specifically, the unmanned transport system may include a transport vehicle (e.g., an overhead hoist transport (OHT) and a rail guided vehicle (RGV)) configured to move along a driving rail installed on the ceiling or floor of a clean room. The operation control of the transport vehicle can be controlled by an upper control device such as an OHT control Server (OCS) device.

SUMMARY

Meanwhile, a front wheel motor and a rear wheel motor of a transport vehicle may be separately controlled through a position command. The front wheel motor and the rear wheel motor may apply force to each other so as to perform the position command in a state where they do not recognize their mutual conditions (e.g., a torque value). Said differently, an interference phenomenon may occur between the motors of the transport vehicle.

Aspects of the present disclosure provide a transport system to minimize an interference between motors of a transport vehicle.

Aspects of the present disclosure also provide a control method of a transport system to minimize interference between motors of a transport vehicle.

The technical aspects of the present disclosure are not restricted to those set forth herein, and other unmentioned technical aspects will be clearly understood by one of ordinary skill in the art to which the present disclosure pertains by referencing the detailed description of the present disclosure given below.

Technical Solution

According to an aspect of the present disclosure, there is provided a transport system comprising: a first motor controller corresponding to a first wheel and configured to generate a first current value; a first motor system configured to move based on the first current value and provide a first position value according to the movement; a disturbance observer configured to receive the first current value and the first position value and calculate a first disturbance value affecting the first motor system; a second motor controller corresponding to a second wheel and configured to generate a second current value; a compensation current generator configured to generate a second compensation current value based on the second current value and the first disturbance value; and a second motor system configured to move by the second compensation current value and provide a second position value according to the movement.

According to another aspect of the present disclosure, there is provided a transport system comprising: a first compensator value corresponding to a first wheel and configured to generate a compensation position value by receiving a position command and a feed-backed first position; a first motor controller configured to generate a first current value corresponding to the compensation position value; a first compensation current generator configured to generate a first compensation current value by subtracting a second disturbance value from the first current value; a first motor system configured to move based on the first compensation current value and provide a first position value according to the movement; a first differentiator configured to generate a speed command by differentiating the position command; a second compensator corresponding to a second wheel and configured to generate a compensation speed value by receiving the speed command and a feed-backed speed value; a second motor controller configured to generate a second current value corresponding to the compensation speed value; a second compensation current generator configured to generate a second compensation current value by subtracting a first disturbance value from the second current value; a second motor system configured to move based on the second compensation current value and provide a second position value according to the movement; and a second differentiator configured to generate the speed value by differentiating the second position value. The first disturbance value indicates an influence of an operation of the second motor system on the first motor system, and the second disturbance value indicates an influence of an operation of the first motor system on the second motor system.

According to an aspect of the present disclosure, there is provided a control method of a transport system comprising: providing the transport system including a first motor system corresponding to a first wheel and a second motor system corresponding to a second wheel; obtaining a first input current value input to the first motor system and a first position value, which is the result of moving the first motor system based on the first input current value; calculating the sum of the first input current value and a first disturbance value from the first position value; calculating the first disturbance value by subtracting the first input current value from the sum of the first input current value and the first disturbance value; and inputting a second input current value subtracted by the first disturbance value to the second motor system.

Specific details of other embodiments are included in the detailed description and the drawings.

BRIEF DESCRIPTION OF THE DRAWINGS

The above and other aspects and features of the present disclosure will become more apparent by describing in detail exemplary embodiments thereof with reference to the attached drawings, in which.

DETAILED DESCRIPTION OF THE EMBODIMENTS

Figure 1:
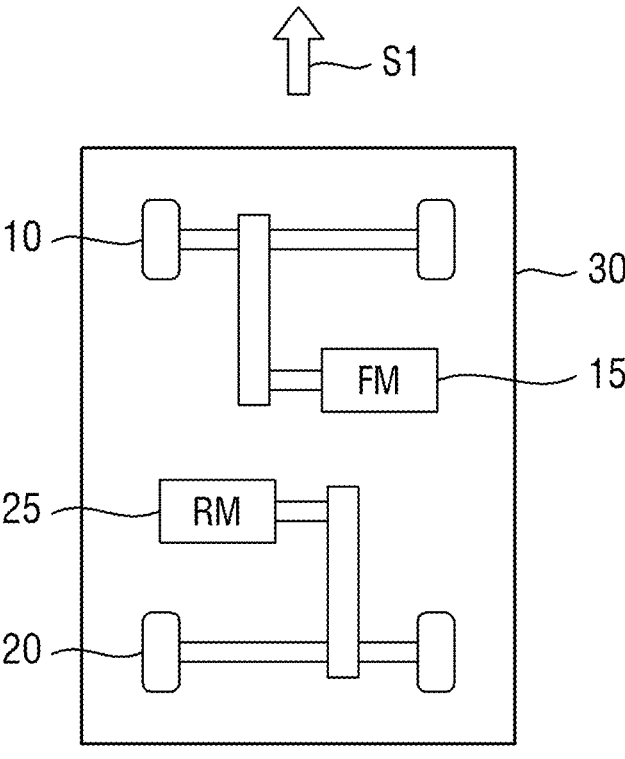
FIGS. 1 and 2 are views describing a transport vehicle used in a transport system according to some embodiments of the present disclosure.

Hereinafter, embodiments of the present disclosure will be described with reference to the attached drawings. The merits and characteristics of the present disclosure and a method for achieving the merits and characteristics will become more apparent from the embodiments described in detail in conjunction with the accompanying drawings. However, the present disclosure is not limited to the disclosed embodiments, but may be implemented in various different ways. The embodiments are provided to only complete the disclosure of the present disclosure and to allow those skilled in the art to understand the category of the present disclosure. The present disclosure is defined by the category of the claims. Like numbers refer to like elements throughout the description of the figures.

The spatially relative terms "below", "beneath", "lower", "above" and "upper" may be used to easily describe the correlation of a device or components with other devices or components. Spatially relative terms are to be understood as including terms in different directions of the device in use or operation in addition to the directions shown in the figures. For example, when flipping a device shown in the figure, a device described as "below" or "beneath" of another device may be placed "above" of another device. Thus, the exemplary term "below" can encompass both an orientation of above and below. The device can also be oriented in other directions, so that spatially relative terms can be interpreted according to orientation.

Although the first, second, etc. are used to describe various elements, components and/or sections, these elements, components and/or sections are of course not limited by these terms. These terms are only used to distinguish one element, component or section from another element, component or section. Therefore, the first device, the first component, or the first section mentioned below may be a second device, a second component, or a second section within the technical spirit of the present disclosure.

Hereinafter, preferred embodiments according to the present disclosure are described in detail with reference to the accompanying drawings. The same or similar elements are assigned the same reference numerals irrespective of their reference numerals, and a redundant description thereof is omitted.

Figure 2:
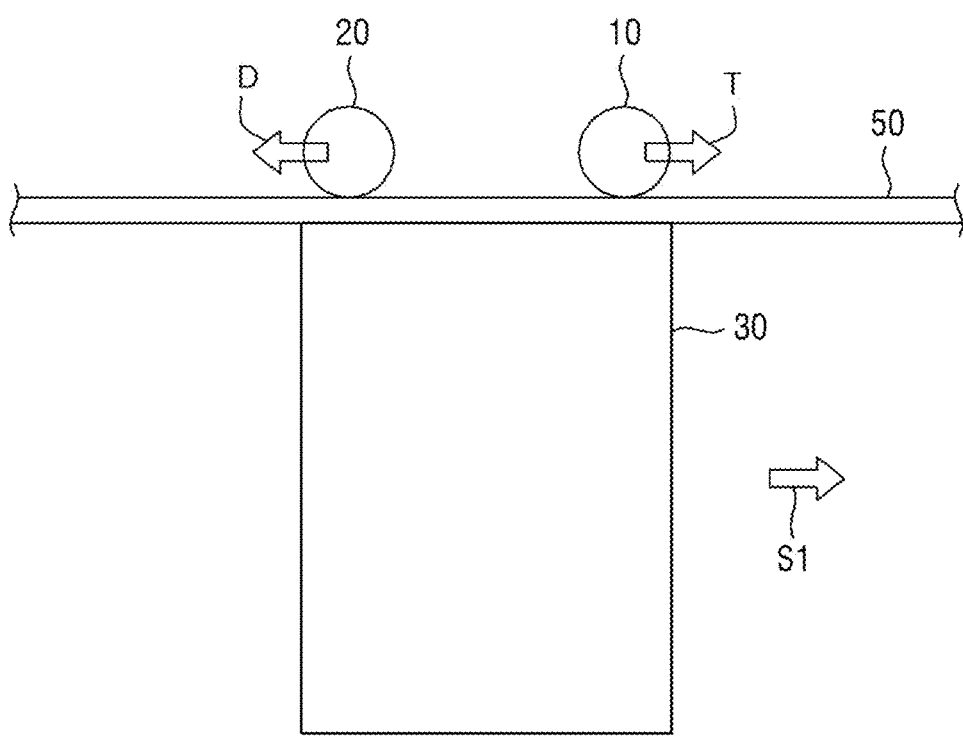

FIGS. 1 and 2 are views describing a transport vehicle used in a transport system according to some embodiments of the present disclosure. FIG. 1 is a top plan view of the transport vehicle when viewed from above, and FIG. 2 is a side view illustrating that the transport vehicle moves along a rail.

Referring to FIGS. 1 and 2, the transport vehicle moves along a rail 50 towards a driving direction S1.

The rail 50 may be installed on a ceiling of a semiconductor manufacturing line or a frame (not shown) coupled to the ceiling. For the rail 50, for instance, two rails may be spaced apart from each other by a predetermined distance. The rail 50 may be implemented in various shapes in a straight line and a curved line.

The transport vehicle picks up an object (not shown) and transfers the object to a variety of positions while moving along the rail 50. The transport vehicle may be driven by receiving power through the rail 50 or may be driven using a rechargeable battery inside the transport vehicle.

The object transferred by the transport vehicle may be a wafer receiving container and a reticle receiving container. An example of the wafer receiving container may be a front opening unified pod (FOUP), but the present disclosure is not limited thereto. An example of the reticle receiving container may be a POD, but the present disclosure is not limited thereto.

The transport vehicle is provided with a first wheel 10 and a second wheel 20 on a body 30 thereof. Based on the driving direction S1 of the transport vehicle, the first wheel 10 may correspond to a front wheel, and the second wheel 20 may correspond to a rear wheel. A first motor 15 may be connected to the first wheel 10 to supply a driving force to the first wheel 10. A second motor 25 may be connected to the second wheel 20 to supply the driving force to the second wheel 20.

The first motor 15 and the second motor 25 may independently generate a torque and may drive the transport vehicle with the torque. In other words, a first motor controller configured to control the first motor 15 and a second motor controller configured to control the second motor 25 do not know their mutual conditions. Therefore, most of the driving torques T (see FIG. 2) generated by one motor (e.g., the first motor 15) is supplied as the driving force of the transport vehicle; however, some torques are supplied as a disturbance D (see FIG. 2) of the other motor (e.g., the second motor 25). This is because the first wheel 10 and the second wheel 20 may influence each other through the rail 50.

In some embodiments of the present disclosure, the disturbance passing to the other motor (e.g., the second motor 25) is predicted by using a disturbance observer 150 (see FIG. 3) and reflected in advance in the control of the other motor. In this way, a phenomenon (or an interference phenomenon) in which the first motor 15 and the second motor 25 interrupt each other can be prevented.

Hereinafter, a control method and system for compensating for an interference phenomenon will be described in detail with reference to FIGS. 3 to 9.

Figure 3:
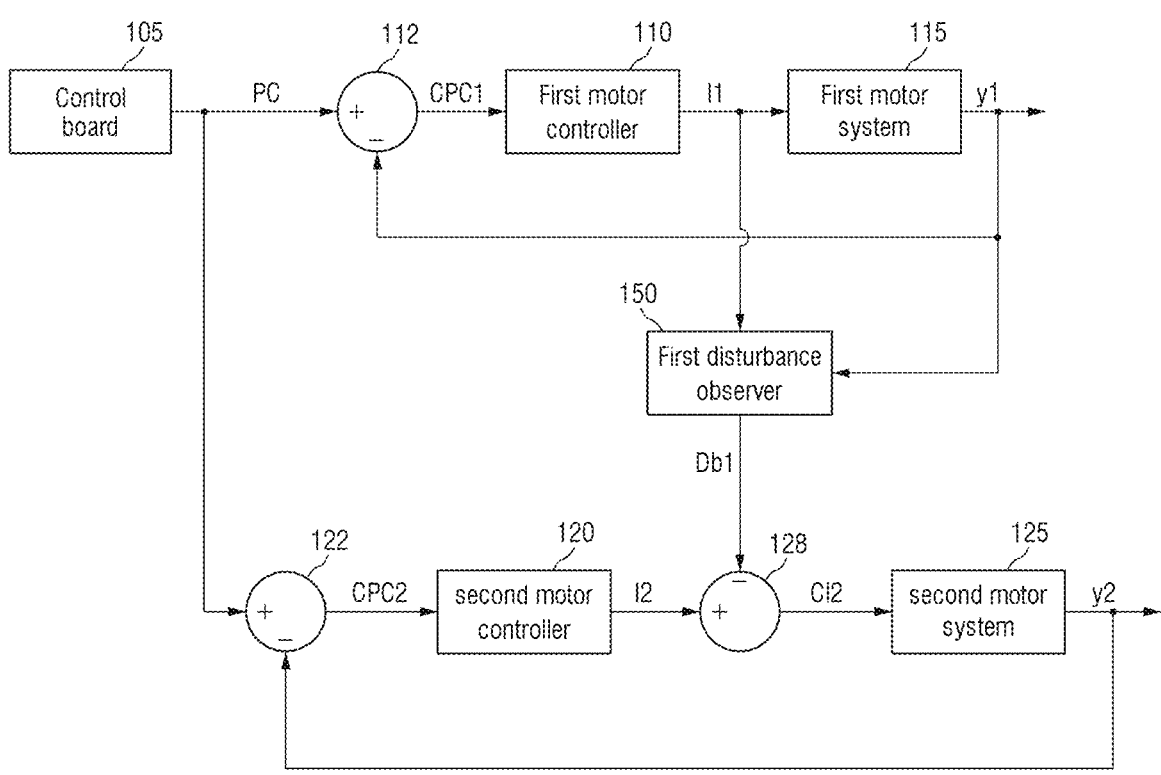
FIG. 3 is a block diagram illustrating a transport system according to a first embodiment of the present disclosure.
Figure 4:
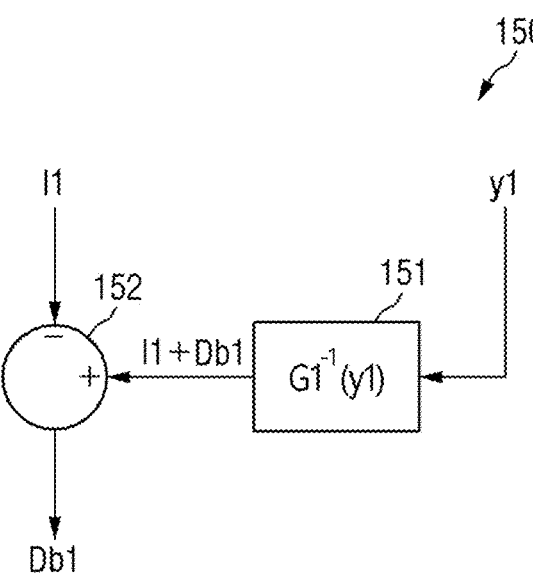
FIG. 4 is a diagram describing a first disturbance observer of FIG. 3.

FIG. 3 is a block diagram illustrating a transport system according to a first embodiment of the present disclosure. FIG. 4 is a diagram describing a first disturbance observer of FIG. 3.

First, referring to FIG. 3, the transport system according to the first embodiment of the present disclosure includes a control board 105, a first motor controller 110, a first compensator 112, a first motor system 115, a second motor controller 120, a second compensator 122, a second motor system 125, a second compensation current generator 128, and a first disturbance observer 150.

Specifically, the control board 105 provides a position command PC. The control board 105 is a computing device configured to control the transport vehicle. The control board 105 may provide, for example, a position profile indicating a position (or a target position) in which the transport vehicle has to be disposed over time.

As the first compensator 112, the first motor controller 110, and the first motor system 115 correspond to the first wheel 10 of the transport vehicle, they are configured to control and drive the first wheel 10. As the second compensator 122, the second motor controller 120, the second compensation current generator 128, and the second motor system 125 correspond to the second wheel 20 of the transport vehicle, they are configured to control and drive the second wheel 20.

The first compensator 112 generates a first compensation position value CPC1 by receiving a position command PC and a feed-backed first position value y1. The first position value y1 may be a position value received from the first motor system 115. For instance, the first compensator 112 may subtract the first position value y1 from the position command PC and calculate the first compensation position value CPC1.

The first motor controller 110 generates a first current value I1 corresponding to the first compensation position value CPC1. The first current value I1 may be an ideal current value that may make a movement by the first compensation position value CPC1.

The first motor system 115 moves based on the first current value I1 (i.e., an input current value). Furthermore, the first motor system 115 provides the first position value y1 according to the movement. As the first motor system 115 is an actual system, it may include the first motor 15 configured to supply the driving force to the first wheel 10 and the corresponding load (e.g., a load of the transport vehicle).

The first disturbance observer 150 calculates a first disturbance value Db1 affecting the first motor system 115. The first disturbance value Db1 refers to an influence of some of the driving torque generated by the second motor 25 on the first motor 15. Alternatively, this refers to an influence of the operation of the second motor system 125 on the operation of the first motor system 115. Since the first wheel 10 and the second wheel 20 influence each other through the rail 50, the first disturbance value Db1 may be generated. The first disturbance observer 150 may use a first inverse function of a first model corresponding to the first motor system 115.

The configuration of the first disturbance observer 150 will be described in detail with reference to FIG. 4.

The first motor system 115 may be modeled as a function $G1(x)$. Herein, as $G1(x)$ is a mathematical expression of the actual system, it may be the first model expressed by modeling the first motor 15 and the corresponding load.

The first disturbance observer 150 includes a first inverse function 151 of the first model and a first operator 152.

The first inverse function 151 may be expressed as $G1^{-1}(x)$.

When only the first current value I1 is input to the first motor system 115 and there is no disturbance at all, there will be $G1(I1)=y1$ and thus $G1^{-1}(y1)=I1$.

However, when the first current value I1 is input to the first motor system 115 and the disturbance affects, since the first position value y1 is a value affected by the disturbance, there will be $G1(I1+Db1)=y1$ and thus $G1^{-1}(y1)=I1+Db1$. When the first position value y1 is input to the first inverse function 151, the sum of the first current value I1 and the first disturbance value Db1 becomes the output. Said differently, the first current value I1 and the first disturbance value Db1 together constitute the output as a result value of the first inverse function 151.

The first operator 152 receives the sum I1+Db1 of the first current value I1 and the first disturbance value Db1 output from the first inverse function 151 and then receives the first current value I1 from the first motor controller 110. The first operator 152 subtracts the first current value I1 from the sum I1+Db1 and calculates the first disturbance value Db1.

The calculated first disturbance value Db1 is used to control the second motor system 125.

Meanwhile, referring again to FIG. 3, the second compensator 122 generates a second compensation position value CPC2 by receiving the position command PC and a feed-backed second position value y2. The second position value y2 may be a position value received from the second motor system 125. For instance, the second compensator 122 may subtract the second position value y2 from the position command PC and calculate the second compensation position value CPC2.

The second motor controller 120 generates a second current value I2 corresponding to the second compensation position value CPC2. The second current value I2 may be an ideal current value that may make a movement by the second compensation position value CPC2.

The second compensation current generator 128 receives the second current value I2 and the first disturbance value Db1 and generates a second compensation current value CI2. For instance, the second compensation current generator 128 may subtract the first disturbance value Db1 from the second current value I2 and generate the second compensation current value CI2.

The second motor system 125 moves based on the second compensation current value CI2 (i.e., the input current value). Furthermore, the second motor system 125 provides the second position value y2 according to the movement. The second motor system 125 is the actual system and may include the second motor 25 configured to supply the driving force to the second wheel 20 and the corresponding load (e.g., the load of the transport vehicle).

As described above, the first disturbance value Db1 refers to the influence of some of the driving torque generated by the second motor 25 on the first motor 15. Accordingly, the second compensation current value CI2 is generated by in advance subtracting the first disturbance value Db1 from the current value I2 generated by the second motor controller 120; then, the second compensation current value CI2 is provided to the second motor system 125. In this way, no excessive driving torque occurs in the second motor 25. Accordingly, the second motor 25 generates a driving torque sufficient not to affect the first motor 15.

In this way, an interference between the first motor 15 and the second motor 25 may be reduced.

Conventionally, when the first motor 15 and the second motor 25 interfere with each other, either one of the first motor 15 and the second motor 25 has to be turned off or a gain of the controller has to be lowered to prevent mutual interference. However, in the transport system according to the first embodiment of the present disclosure, since the first motor 15 and the second motor 25 do not interfere with each other, the bandwidth of the controller and the gain can be increased to maximize performance. Accordingly, performance of the first motor 15 and the second motor 25 may be maximized.

Figure 5:
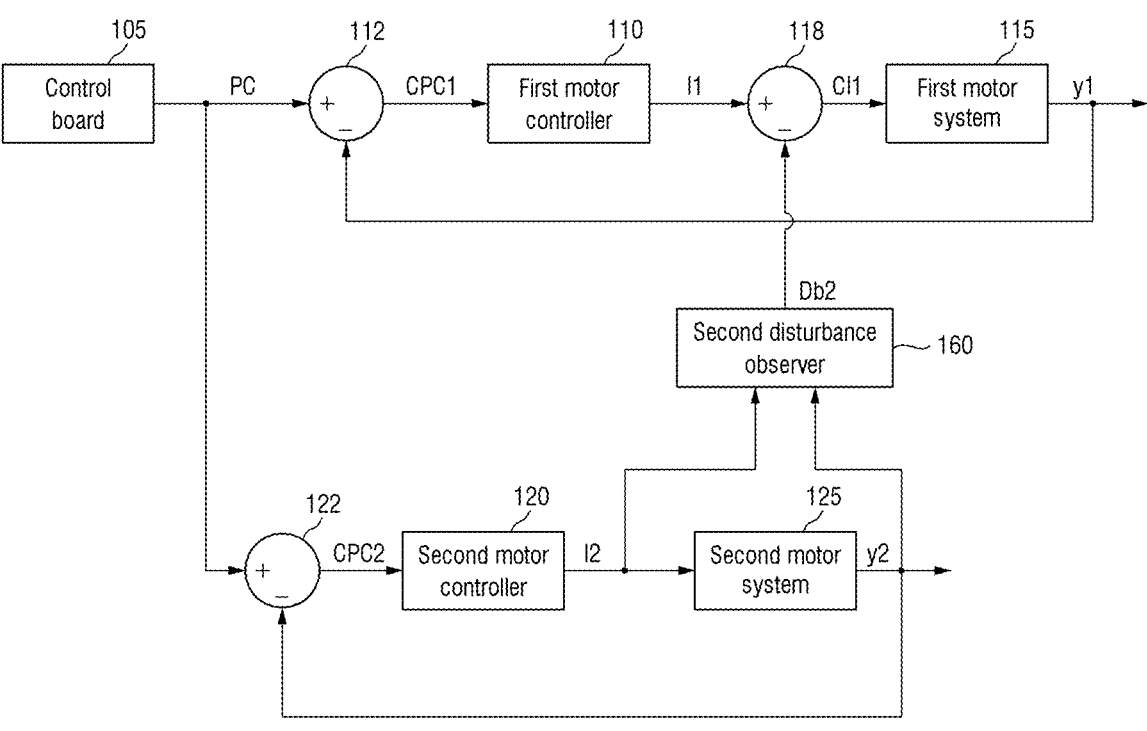
FIG. 5 is a block diagram describing the transport system according to a second embodiment of the present disclosure.
Figure 6:
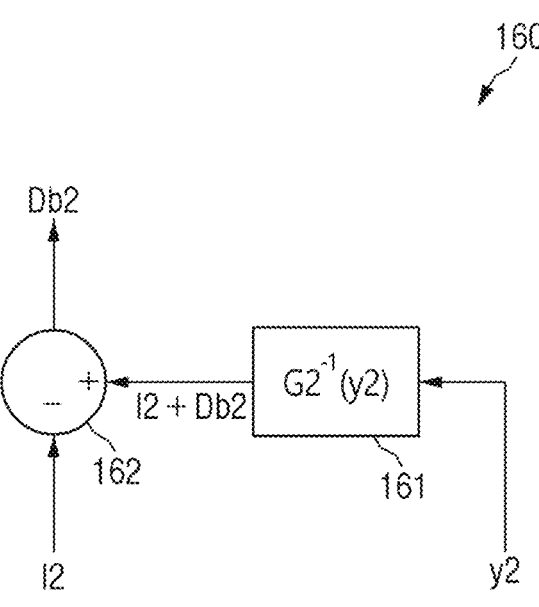
FIG. 6 is a diagram describing a second disturbance observer of FIG. 5.

FIG. 5 is a block diagram describing the transport system according to a second embodiment of the present disclosure. FIG. 6 is a diagram describing a second disturbance observer of FIG. 5. For convenience of description, the differences from the content described using FIGS. 3 and 4 will be mainly described.

The transport system illustrated in FIG. 3 includes the first disturbance observer 150, while the transport system illustrated in FIG. 5 does not include the first disturbance observer 150 and may include a second disturbance observer 160.

Specifically, the transport system according to the second embodiment of the present disclosure includes a control board 105, a first motor controller 110, a first compensator 112, a first motor system 115, a first compensation current generator 118, a second motor controller 120, a second compensator 122, a second motor system 125, and a second disturbance observer 160.

The control board 105 provides the position command PC.

The second compensator 122 generates a second compensation position value CPC2 by receiving the position command PC and the feed-backed second position value y2. The second motor controller 120 generates the second current value I2 corresponding to the second compensation position value CPC2. The second motor system 125 moves based on the second current value I2. Furthermore, the second motor system 125 provides the second position value y2, which is the result of the movement.

Meanwhile, the second disturbance observer 160 calculates a second disturbance value Db2 affecting the second motor system 125. The second disturbance value Db2 refers to the influence of some of the driving torque generated by the first motor 15 on the second motor 25. Alternatively, this refers to the influence of the operation of the first motor system 115 on the operation of the second motor system 125. Since the first wheel 10 and the second wheel 20 may influence each other through the rail 50, the second disturbance value Db2 is generated. The second disturbance observer 160 may use a second inverse function of the second model corresponding to the second motor system 125.

Herein, the configuration of the second disturbance observer 160 will be described in detail with reference to FIG. 6.

The second motor system 125 may be modeled as a function G2(x). Herein, as G2(x) is a mathematical expression of the actual system, it may be a second model expressed by modeling the second motor 25 and the corresponding load.

The second disturbance observer 160 includes a second inverse function 161 of the second model and a second operator 162.

The second inverse function 161 may be expressed as $G2^{-1}(x)$.

When only the second current value I2 is input to the second motor system 125 and there is no disturbance at all, there will be G2(I2)=y2 and thus $G2^{-1}$(y2)=I2.

However, when the second current value I2 is input to the second motor system 125 and the disturbance affects, since the second position value y2 is a value affected by the disturbance, there will be G2(I2+Db2)=y2 and thus $G2^{-1}$(y2)=I2+Db2. When the second position value y2 is input to the second inverse function 161, the sum of the second current value I2 and the second disturbance value Db2 becomes the output. Said differently, the second current value I2 and the second disturbance value Db2 together constitute the output in the second inverse function 161.

The second operator 162 receives the sum I2+Db2 of the second current value I2 and the second disturbance value Db2 from the second inverse function 161 and then receives the second current value I2 from the second motor controller 120. The second calculator 162 subtracts the second current value I2 from the sum I2+Db2 and calculates the second disturbance value Db2.

The calculated second disturbance value Db2 is used to control the first motor system 115.

Referring back to FIG. 5, the first compensator 112 generates the first compensation position value CPC1 by receiving the position command PC and the feed-backed first position value y1. The first motor controller 110 generates the first current value I1 corresponding to the first compensation position value CPC1. The first compensation current generator 118 receives the first current value I1 and the second disturbance value Db2 and subtracts the second disturbance value Db2 from the first current value I1 to generate the first compensation current value CI1. The first motor system 115 moves based on the first compensation current value CI1. Furthermore, the first motor system 115 provides the first position value y1, which is the result of the movement.

The first compensation current value CI1 is generated by in advance subtracting the second disturbance value Db2 from the current value I1 generated by the first motor controller 110; then the first compensation current value CI1 is provided to the first motor system 115. In this way, no excessive driving torque occurs in the first motor 15. Accordingly, the first motor 15 generates the driving torque sufficient not to affect the first motor 25. In this way, the mutual interference is reduced.

Figure 7:
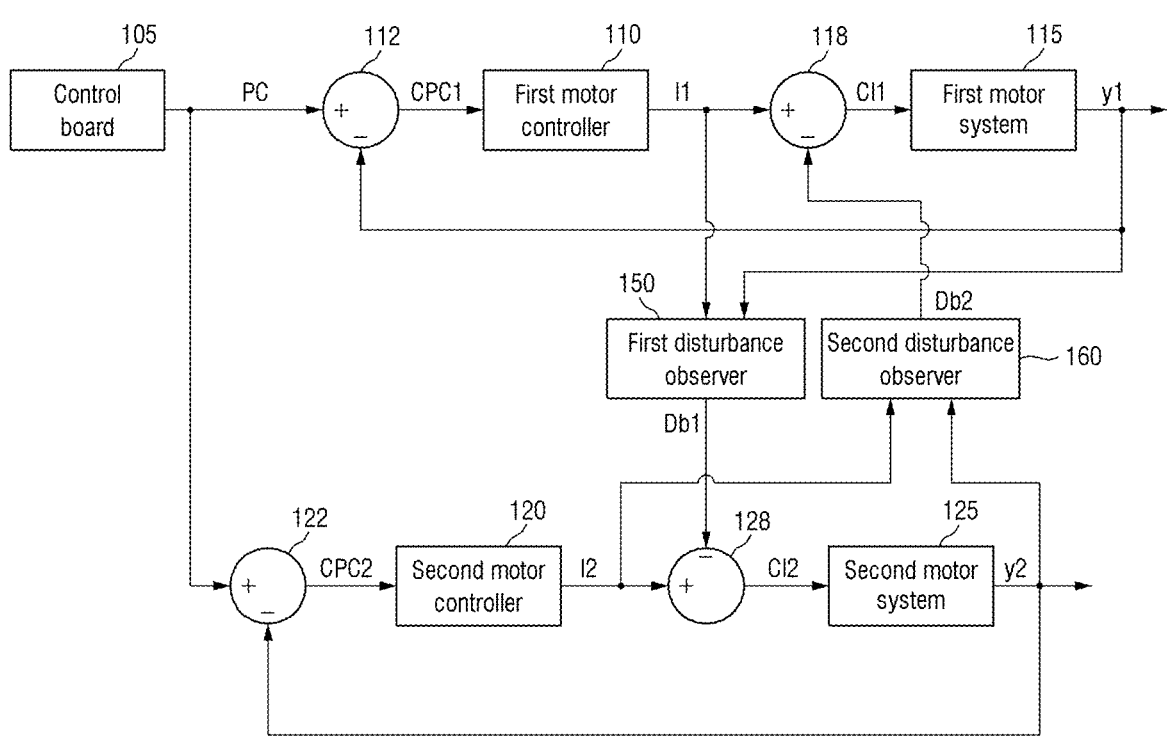
FIG. 7 is a block diagram describing a transport system according to a third embodiment of the present disclosure.

FIG. 7 is a block diagram describing the transport system according to a third embodiment of the present disclosure. For convenience of description, the differences from the content described using FIGS. 3 to 6 will be mainly described.

Referring to FIG. 7, the transport system according to the second embodiment of this disclosure includes the control board 105, the first motor controller 110, the first compensator 112, the first motor system 115, the first compensation current generator 118, the second motor controller 120, the second compensator 122, the second motor system 125, the second compensation current generator 128, the first disturbance observer 150, and the second disturbance observer 160.

The control board 105 provides the position command PC.

The first compensator 112 generates the first compensation position value CPC1 by receiving the position command PC and the feed-backed first position value y1. The first motor controller 110 generates the first current value I1 corresponding to the first compensation position value CPC1. The first compensation current generator 118 receives the first current value I1 and the second disturbance value Db2 and subtracts the second disturbance value Db2 from the first current value I1 to generate the first compensation current value CI1. The first motor system 115 moves based on the first compensation current value CI1. Furthermore, the first motor system 115 provides the first position value y1, which is the result of the movement.

The first disturbance observer 150 calculates the first disturbance value Db1 affecting the first motor system 115.

The second compensator 122 generates the second compensation position value CPC2 by receiving the position command PC and the feed-backed second position value y2. The second motor controller 120 generates the second current value I2 corresponding to the second compensation position value CPC2. The second compensation current generator 128 receives the second current value I2 and the first disturbance value Db1 and subtracts the first disturbance value Db1 from the second current value I2 to generate the second compensation current value CI2. The second motor system 125 moves based on the second compensation current value CI2. Furthermore, the second motor system 125 provides the second position value y2, which is the result of the movement.

The second disturbance observer 160 calculates the second disturbance value Db2 affecting the second motor system 125.

In this way, no excessive driving torque occurs in the first motor 15 and the second motor 25. In other words, the first motor 15 generates the driving torque sufficient not to affect the second motor 25, and the second motor 25 generates the driving torque sufficient not to affect the first motor 15. Accordingly, the mutual interference between the first motor 15 and the second motor 25 may be reduced.

Figure 8:
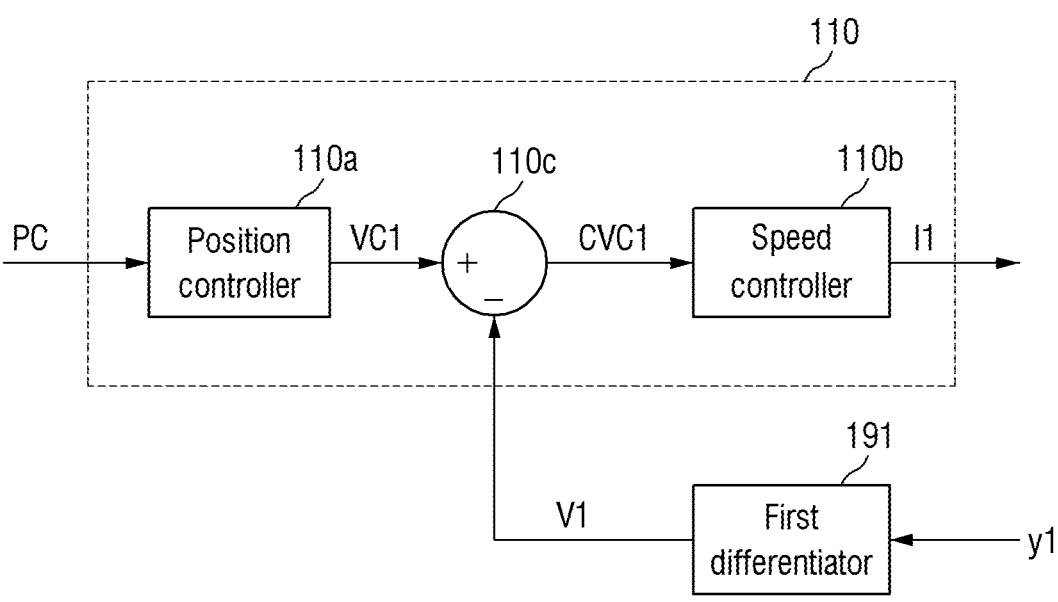
FIG. 8 is a block diagram describing the transport system according to a fourth embodiment of the present disclosure.

FIG. 8 is a block diagram describing the transport system according to a fourth embodiment of the present disclosure. For convenience of description, the difference from the content described using FIGS. 3 and 4 will be mainly described.

In the transport system illustrated in FIG. 3, the first motor 15 can be controlled based on the position, whereas in the transport system illustrated in FIG. 8, the first motor 15 can be controlled based on speed.

Specifically, the transport system of FIG. 8 does not include the first compensator 112 of FIG. 3.

The first motor controller 110 includes a position controller 110*a*, a speed controller 110*b*, and a fourth compensator 110*c*.

The position controller 110*a* receives the position command PC from the control board 105 and generates a first speed command VC1 corresponding to the position command PC. The position controller 110*a* may generate the first speed command VC1 by differentiating the position command PC, but the present disclosure is not limited thereto.

A first differentiator 191 differentiates the feed-backed first position value y1 to generate a first speed value V1.

The fourth compensator 110*c* generates a first compensation speed value CVC1 by receiving the first speed command VC1 and the first speed value V1. The fourth compensator 110*c* may generate the first compensation speed value CVC1 by subtracting the first speed value V1 from the first speed command VC1, but the present disclosure is not limited thereto.

The speed controller 110*b* generates the first current value I1 corresponding to the first compensation speed value CVC1.

Meanwhile, the use of the first differentiator 191 may also be applied to the systems illustrated in FIGS. 3, 5 and 7.

Figure 9:
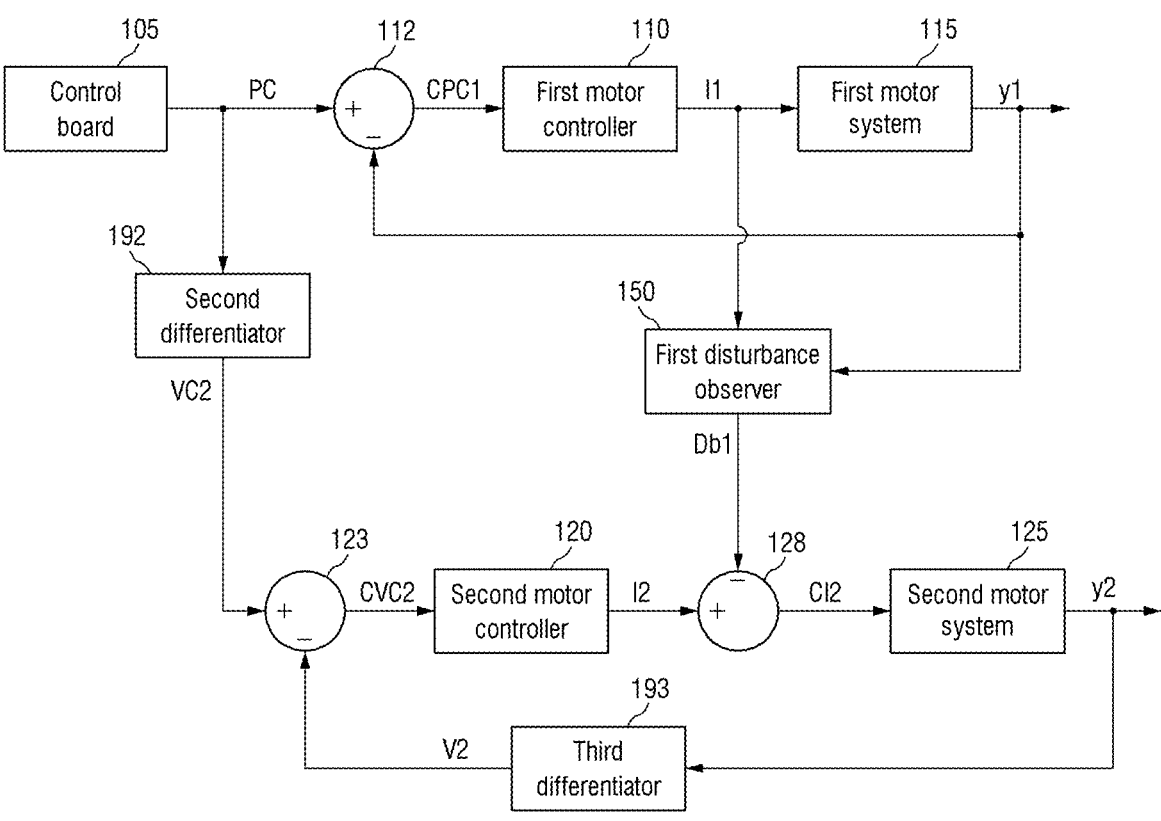
FIG. 9 is a block diagram describing the transport system according to a fifth embodiment of the present disclosure.

FIG. 9 is a block diagram describing the transport system according to a fifth embodiment of the present disclosure. For convenience of description, the differences from the content described using FIGS. 3 and 4 will be mainly described.

In the transport system illustrated in FIG. 3, the second motor 25 is controlled based on the position, whereas in the transport system illustrated in FIG. 9, the second motor 25 is controlled based on speed.

Specifically, in the transport system illustrated in FIG. 3, the second compensator 122 generates the second compensation position value CPC2 using the position command PC and the feed-backed second position value y2.

On the other hand, in the transport system illustrated in FIG. 9, the second differentiator 192 differentiates the position command PC to generate a second speed command VC2, and a third differentiator 193 differentiates the second position value y2 to generate a second speed value V2.

Accordingly, a third compensator 123 generates the second compensation speed value CVC2 by receiving the second speed command VC2 and the second speed value V2. The second motor controller 120 receives the second compensation speed value CVC2 and then generates the second current value I2 corresponding to the second compensation speed value CVC2.

The second compensation current generator 128 receives the second current value I2 and the first disturbance value Db1 and generate the second compensation current value CI2 by subtracting the first disturbance value Db1 from the second current value I2. The second motor system 125 moves based on the second compensation current value CI2. Further, the second motor system 125 provides the moved second position value y2.

Unlike what is illustrated, the use of the second differentiator 192 and the third differentiator 193 can also be applied to the systems illustrated in FIGS. 5, 7 and 8.

Although the embodiments of the present disclosure have been described above with reference to the accompanying drawings, the present disclosure is not limited to the disclosed embodiments, but may be implemented in various different ways, and the present disclosure may be embodied in many different forms without changing technical subject matters and essential features as will be understood by those skilled in the art. Therefore, embodiments set forth herein are exemplary only and not to be construed as a limitation.

What is claimed is:

1. A transport system, comprising:
   a first motor controller corresponding to a first wheel and configured to generate a first current value;
   a first motor system configured to move based on the first current value and provide a first position value according to the movement;
   a disturbance observer configured to receive the first current value and the first position value and calculate a first disturbance value affecting the first motor system;
   a second motor controller corresponding to a second wheel and configured to generate a second current value;
   a compensation current generator configured to generate a compensation current value based on the second current value and the first disturbance value;
   a second motor system configured to move by the compensation current value and provide a second position value according to the movement; and
   a first differentiator configured to receive feedback of the first position value and differentiate the feed-backed first position to generate a first speed value.

2. The transport system of claim 1, wherein the disturbance observer comprises:
   a first inverse function of a first model corresponding to the first motor system, the first inverse function configured to receive the first position value and output the sum of the first current value and the first disturbance value; and
   a first operator configured to generate the first disturbance value by subtracting the first current value from the sum output from the first inverse function.

3. The transport system of claim 1, wherein the compensation current generator calculates the compensation current value by subtracting the first disturbance value from the second current value.

4. The transport system of claim 1, comprising: a compensator configured to receive a position command from a control board and receive feedback of the first position value from the first motor system to generate a first compensation position value, wherein the first motor controller generates the first current value corresponding to the first compensation position value.

5. The transport system of claim 1, further comprising: a compensator configured to receive a position command from a control board and receive feedback of the second position value from the second motor system to generate a second compensation position value, wherein the second motor controller generates the second current value corresponding to the second compensation position value.

6. The transport system of claim 1, wherein the first motor controller comprises:

a position controller configured to receive a position command from a control board and generate a first speed command corresponding to the position command;

a compensator configured to generate a first compensation speed value by subtracting the first speed value from the first speed command; and a speed controller configured to generate the first current value corresponding to the first compensation speed value.

7. The transport system of claim 1, further comprising:

a second differentiator configured to differentiate the position command and generate a second speed command;

a third differentiator configured to receive feedback of the second position value from the second motor system and differentiate the second position value to generate a second speed value; and a compensator configured to receive the second speed command and the second speed value and generate a second compensation speed value, wherein the second motor controller receives the second compensation speed value and generates the second current value corresponding to the second compensation speed value.

8. The transport system of claim 1, wherein the first wheel is a front wheel, and the second wheel is a rear wheel.

9. A transport system, comprising:

a first compensator corresponding to a first wheel and configured to receive a position command and a feedbacked first position and generate a compensation position value;

a first motor controller configured to generate a first current value corresponding to the compensation position value;

a first compensation current generator configured to generate a first compensation current value by subtracting a second disturbance value from the first current value;

a first motor system configured to move based on the first compensation current value and provide a first position value according to the movement;

a first differentiator configured to differentiate the position command and generate a first speed command;

a second compensator corresponding to a second wheel and configured to receive the first speed command and a feed-backed speed value and generate a compensation speed value;

a second motor controller configured to generate a second current value corresponding to the compensation speed value;

a second compensation current generator configured to generate a second compensation current value by subtracting a first disturbance value from the second current value;

a second motor system configured to move based on the second compensation current value and provide a second position value according to the movement; and a second differentiator configured to differentiate the second position value and generate a second speed command;

wherein the first disturbance value indicates an influence of an operation of the second motor system on the first motor system, and the second disturbance value indicates an influence of an operation of the first motor system on the second motor system.

10. The transport system of claim 9, further comprising: a disturbance observer configured to generate the first disturbance value, wherein the disturbance observer includes a inverse function of a model corresponding to the first motor system.

11. The transport system of claim 9, further comprising: a disturbance observer configured to generate the second disturbance value, wherein the disturbance observer includes a inverse function of a model corresponding to the second motor system.

12. The transport system of claim 9, wherein the first wheel is a front wheel, and the second wheel is a rear wheel.

13. A control method of a transport system, the method comprising:

providing the transport system including a first motor system corresponding to a first wheel and a second motor system corresponding to a second wheel;

obtaining a first input current value input to the first motor system and a first position value, which is the result of moving the first motor system based on the first input current value;

calculating the sum of the first input current value and a first disturbance value from the first position value;

calculating the first disturbance value by subtracting the first input current value from the sum of the first input current value and the first disturbance value;

inputting a second input current value subtracted by the first disturbance value to the second motor system; and generating a first compensation position value by subtracting the first position value from a position command received from a control board, wherein the first input current value is a current value corresponding to the first compensation position value.

14. The control method of a transport system of claim 13, further comprising:

generating a second compensation position value by subtracting a second position value of the second motor system from a position command received from a control board; and generating a second current value corresponding to the second compensation position value, wherein the second input current value input to the second motor system is generated by subtracting a first distortion value from the second current value.

15. The control method of a transport system of claim 13, further comprising;

generating a speed command by differentiating a position command received from a control board;

generating a speed value by differentiating a second position value feed-backed from the second motor system;

generating a compensation speed value by receiving the speed command and the speed value; and generating a second current value corresponding to a compensation position value, wherein the second input current value input to the second motor system is generated by subtracting a first distortion value from the second current value.

* * * * *